US012671063B2

(12) United States Patent
Nichols et al.

(10) Patent No.: US 12,671,063 B2
(45) Date of Patent: Jun. 30, 2026

(54) LOW PRESSURE LIFT PIN CAVITY HARDWARE

(71) Applicant: Applied Materials, Inc., Santa Clara, CA (US)

(72) Inventors: Michael Thomas Nichols, Sunnyvale, CA (US); Imad Yousif, San Jose, CA (US); John Anthony O'Malley, III, San Jose, CA (US); Steven E. Babayan, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 759 days.

(21) Appl. No.: 15/687,737

(22) Filed: Aug. 28, 2017

(65) Prior Publication Data

US 2018/0061616 A1     Mar. 1, 2018

Related U.S. Application Data

(60) Provisional application No. 62/380,084, filed on Aug. 26, 2016.

(51) Int. Cl.
*H01J 37/32*     (2006.01)
*C23C 16/44*     (2006.01)

(52) U.S. Cl.
CPC .. *H01J 37/32449* (2013.01); *H01J 37/32715* (2013.01); *H01J 37/32834* (2013.01);
(Continued)

(58) Field of Classification Search
CPC .. B01J 2219/00894; B01J 2219/00903; C25D 17/001; C30B 25/14; C23C 14/50;
(Continued)

(56) References Cited

U.S. PATENT DOCUMENTS 5,476,548 A * 12/1995 Lei ................... C23C 16/45521
                                                        118/728
5,856,906 A * 1/1999 Kholodenko ..... H01L 21/67109
                                                        361/234
(Continued)

FOREIGN PATENT DOCUMENTS

CN       101764042 A     6/2010
CN       101919041 A     12/2010
(Continued)

OTHER PUBLICATIONS

"Chapter 19: Rough Vacuum Pumping" in John F. O'Hanlon. "A User's Guide to Vacuum Technology, 3rd Edition." Wiley-InterScience 2003. pp. 359-378. (Year: 2003).*
(Continued)

*Primary Examiner* — Jeffrie R Lund
(74) *Attorney, Agent, or Firm* — Patterson + Sheridan, LLP

(57) ABSTRACT

Embodiments disclosed herein generally relate to a pumping system for a plasma processing apparatus. The pumping system includes a first pump path, a second pump path, a first valve, and a second valve. The first pump path couples an opening of a substrate support assembly of the processing chamber to an exhaust port of the processing chamber. The second pump path couples the opening of the substrate support assembly to an evacuation region of the processing chamber. The first valve is positioned in the first pump path. The first valve is configurable between a first state and a second state. The second valve is positioned in the second pump path. The second valve is configurable between the first state and the second state.

11 Claims, 4 Drawing Sheets

(52) U.S. Cl.
CPC .... *H01J 37/32862* (2013.01); *C23C 16/4412* (2013.01); *H01J 37/32733* (2013.01); *H01J 2237/006* (2013.01); *H01J 2237/334* (2013.01)

(58) Field of Classification Search
CPC ... C23C 14/54; C23C 14/564; C23C 16/4401; C23C 16/4408; C23C 16/4409; C23C 16/4412; C23C 16/455; C23C 16/4558; C23C 16/45589; C23C 16/45591; C23C 16/458; C23C 16/4585; C23C 16/52; C23C 16/45587; C23C 14/56; F15D 1/025; F16K 39/00; F16K 17/20; F16K 17/24; F16K 17/26; F16K 17/32; H01J 9/38; H01J 2237/022; H01J 2237/334; H01J 37/16; H01J 37/32009; H01J 37/32431; H01J 37/3244; H01J 37/32449; H01J 37/32458; H01J 37/32495; H01J 37/32623; H01J 37/32633; H01J 37/32642; H01J 37/32651; H01J 37/32715; H01J 37/32807; H01J 37/32834; H01J 37/32871; H01J 37/3441; H01J 37/32862; H01J 2237/006; H01J 37/32733; Y10S 438/935; Y10T 137/85938; F04D 15/00; F04D 15/0005; F04D 15/0011; F04D 15/0022; F04D 15/0027; F04D 15/0033; F04D 15/0038; F04D 15/005; F04D 17/00; F04D 17/02; F04D 17/16; F04D 17/164; F04D 17/168; F04D 19/00; F04D 19/002; F04D 19/007; F04D 19/02; F04D 19/022; F04D 19/024; F04D 19/026; F04D 19/028; F04D 19/04; F04D 19/042; F04D 19/044; F04D 19/046; F04D 19/048; F04D 27/00; F04D 27/002; F04D 27/003; F04D 27/004; F04D 27/005; F04D 27/006; F04D 27/009; H01L 21/67069; H01L 21/67161; H01L 21/6719; H01L 21/68764; H01L 21/68785
See application file for complete search history.

(56) References Cited

U.S. PATENT DOCUMENTS

| | | | | | |
|---|---|---|---|---|---|
| 5,944,049 | A * | 8/1999 | Beyer | | F04B 49/08 |
| | | | | | 137/14 |
| 6,017,414 | A * | 1/2000 | Koemtzopoulos | | |
| | | | | | H01J 37/32862 |
| | | | | | 134/1.1 |
| 6,063,198 | A * | 5/2000 | Bang | | C23C 16/44 |
| | | | | | 118/692 |
| 6,080,679 | A * | 6/2000 | Suzuki | | C23C 14/564 |
| | | | | | 438/726 |
| 6,161,576 | A * | 12/2000 | Maher | | F04D 19/04 |
| | | | | | 137/565.23 |
| 6,196,532 | B1 * | 3/2001 | Otwell | | B25B 11/005 |
| | | | | | 269/21 |
| 6,598,615 | B1 * | 7/2003 | Holland | | H01J 37/32834 |
| | | | | | 137/14 |
| 9,741,546 | B2 * | 8/2017 | Carducci | | H01J 37/32541 |
| 9,991,153 | B2 * | 6/2018 | Hou | | H01L 21/67115 |
| 10,453,656 | B2 * | 10/2019 | Carducci | | H01J 37/32743 |
| 10,535,502 | B2 * | 1/2020 | Carducci | | H01J 37/32834 |
| 10,546,728 | B2 * | 1/2020 | Carducci | | H01J 37/32568 |
| 10,559,451 | B2 * | 2/2020 | Kalnin | | F16K 51/02 |
| 10,580,620 | B2 * | 3/2020 | Carducci | | H01J 37/32733 |
| 2001/0052393 | A1 * | 12/2001 | Okabe | | C23C 16/4412 |
| | | | | | 156/345.29 |
| 2002/0005167 | A1 * | 1/2002 | Miyamoto | | C23C 16/4412 |
| | | | | | 118/715 |
| 2002/0011204 | A1 * | 1/2002 | Gujer | | C23C 16/4586 |
| | | | | | 118/500 |
| 2002/0043750 | A1 * | 4/2002 | Lenz | | H01L 21/6831 |
| | | | | | 269/13 |
| 2002/0157960 | A1 * | 10/2002 | Dordi | | C25D 17/001 |
| | | | | | 205/143 |
| 2002/0163637 | A1 * | 11/2002 | Rossman | | H01L 21/02274 |
| | | | | | 356/237.4 |
| 2003/0026904 | A1 * | 2/2003 | Yadav | | H01L 21/6838 |
| | | | | | 427/294 |
| 2003/0068233 | A1 * | 4/2003 | Royce | | F04B 37/14 |
| | | | | | 417/251 |
| 2003/0205329 | A1 * | 11/2003 | Gujer | | C23C 16/45561 |
| | | | | | 156/345.51 |
| 2004/0089227 | A1 * | 5/2004 | Wang | | H01L 21/67017 |
| | | | | | 118/47 |
| 2004/0228747 | A1 * | 11/2004 | Desbiolles | | F04D 27/00 |
| | | | | | 417/423.4 |
| 2005/0120805 | A1 * | 6/2005 | Lane | | H01J 37/32449 |
| | | | | | 73/861 |
| 2005/0133059 | A1 * | 6/2005 | Chen | | B08B 7/00 |
| | | | | | 134/1.1 |
| 2005/0196254 | A1 * | 9/2005 | Kim | | H01L 21/67017 |
| | | | | | 414/217 |
| 2005/0226739 | A1 * | 10/2005 | Huntley | | F04D 17/168 |
| | | | | | 417/313 |
| 2006/0034715 | A1 * | 2/2006 | Boger | | F04B 37/14 |
| | | | | | 417/423.4 |
| 2006/0121211 | A1 * | 6/2006 | Choi | | H01J 37/32834 |
| | | | | | 427/569 |
| 2006/0194435 | A1 * | 8/2006 | Nishimura | | H01L 21/02063 |
| | | | | | 438/689 |
| 2006/0196421 | A1 * | 9/2006 | Ronsse | | C23C 16/4401 |
| | | | | | 118/715 |
| 2006/0196527 | A1 * | 9/2006 | Nishimura | | G03F 7/425 |
| | | | | | 134/2 |
| 2007/0187363 | A1 * | 8/2007 | Oka | | H01J 37/3244 |
| | | | | | 216/59 |
| 2007/0209588 | A1 | 9/2007 | Li | | |
| 2007/0212846 | A1 * | 9/2007 | Yokouchi | | H01L 21/67201 |
| | | | | | 438/402 |
| 2008/0229811 | A1 * | 9/2008 | Zhao | | F16C 29/025 |
| | | | | | 73/104 |
| 2008/0305632 | A1 * | 12/2008 | Nishimura | | H01L 21/6719 |
| | | | | | 438/680 |
| 2009/0008035 | A1 * | 1/2009 | Iwai | | H01J 37/32082 |
| | | | | | 156/345.47 |
| 2009/0020227 | A1 * | 1/2009 | Andou | | H01L 21/67109 |
| | | | | | 156/345.37 |
| 2009/0277388 | A1 * | 11/2009 | Lubomirsky | | C23C 16/4581 |
| | | | | | 118/725 |
| 2009/0288684 | A1 * | 11/2009 | Kitaoka | | C23C 16/4586 |
| | | | | | 134/21 |
| 2010/0096109 | A1 * | 4/2010 | Zhang | | H05B 7/18 |
| | | | | | 165/104.19 |
| 2010/0132891 | A1 * | 6/2010 | Nozawa | | F16K 3/06 |
| | | | | | 156/345.41 |
| 2011/0049100 | A1 * | 3/2011 | Han | | H01L 21/68785 |
| | | | | | 216/67 |
| 2011/0265814 | A1 * | 11/2011 | Cruse | | H01L 21/6719 |
| | | | | | 134/1.1 |
| 2011/0265884 | A1 * | 11/2011 | Xu | | H01L 21/67017 |
| | | | | | 137/14 |
| 2011/0265951 | A1 * | 11/2011 | Xu | | C23C 16/46 |
| | | | | | 156/345.26 |
| 2011/0266256 | A1 * | 11/2011 | Cruse | | H01J 37/32899 |
| | | | | | 216/59 |
| 2012/0024394 | A1 * | 2/2012 | Bounouar | | F04D 19/04 |
| | | | | | 137/14 |
| 2012/0132619 | A1 * | 5/2012 | Matsuda | | C23C 16/4412 |
| | | | | | 216/67 |
| 2013/0087286 | A1 * | 4/2013 | Carducci | | H01J 37/32733 |
| | | | | | 156/345.43 |

(56) References Cited

U.S. PATENT DOCUMENTS

| | | | |
|---|---|---|---|
| 2013/0156610 A1* | 6/2013 | Gregor | F04B 37/14 417/53 |
| 2014/0072452 A1* | 3/2014 | Tahmassebpur | H01J 37/32513 417/51 |
| 2014/0190513 A1* | 7/2014 | Lee | H01L 21/67766 134/1.2 |
| 2014/0265090 A1* | 9/2014 | Hou | H01L 21/68785 269/14 |
| 2014/0374024 A1* | 12/2014 | Nguyen | H01J 37/32899 156/345.31 |
| 2015/0125591 A1* | 5/2015 | Hsieh | C23C 16/45525 427/8 |
| 2015/0152557 A1* | 6/2015 | Okura | C23C 16/45561 427/8 |
| 2015/0218697 A1* | 8/2015 | Nguyen | H01J 37/32623 427/569 |
| 2015/0252473 A1* | 9/2015 | Dickinson | H01J 37/32834 156/345.33 |
| 2015/0293527 A1* | 10/2015 | Nguyen | H01L 21/6719 700/121 |
| 2016/0010207 A1* | 1/2016 | Wang | H01J 37/32357 118/723 R |
| 2016/0027652 A1* | 1/2016 | Jeon | H01L 21/31138 438/703 |
| 2016/0064189 A1* | 3/2016 | Tandou | H01J 37/32192 156/345.33 |
| 2016/0099166 A1* | 4/2016 | Yudovsky | H01L 21/68764 29/559 |
| 2017/0069469 A1* | 3/2017 | Goodyear | H01J 37/32174 |
| 2017/0352565 A1* | 12/2017 | Zhang | H01L 21/67109 |
| 2018/0061616 A1* | 3/2018 | Nichols | H01J 37/32834 |
| 2018/0233327 A1* | 8/2018 | Kalnin | H01J 37/32715 |
| 2019/0027394 A1* | 1/2019 | Sarode Vishwanath | H01L 21/67017 |

FOREIGN PATENT DOCUMENTS

| | | | |
|---|---|---|---|
| CN | 103035469 A | | 4/2013 |
| JP | S61017151 A | | 1/1986 |
| JP | H11243079 A | | 9/1999 |
| JP | 2001196447 A | * | 7/2001 |
| KR | 20130037195 A | | 4/2013 |
| KR | 20150096213 A | * | 8/2015 |
| KR | 20150104813 A | * | 9/2015 |
| KR | 20150114630 A | * | 10/2015 |
| TW | 201116720 A | | 5/2011 |
| TW | 201537653 A | | 10/2015 |

OTHER PUBLICATIONS

"Chapter 20: High Vacuum Systems" in John F. O'Hanlon. "A User's Guide to Vacuum Technology, 3rd Edition." Wiley-InterScience. 2003. pp. 379-402. (Year: 2003).*

Office Action from Taiwan Patent Application No. 106129128 dated Jan. 22, 2019.

International Search Report and Written Opinion for PCT/US2017/048642 dated Nov. 15, 2017.

Office Action from Chinese Patent Application No. 201780047362.8 dated May 6, 2020.

Office Action from Korean Patent Application No. 10-2019-7006022 dated Jul. 21, 2020.

Office Action from Taiwan Patent Application No. 10812404 dated Nov. 17, 2020.

Office Action from Chinese Patent Application No. 201780047362.8 dated Nov. 27, 2020.

* cited by examiner

FIG. 3

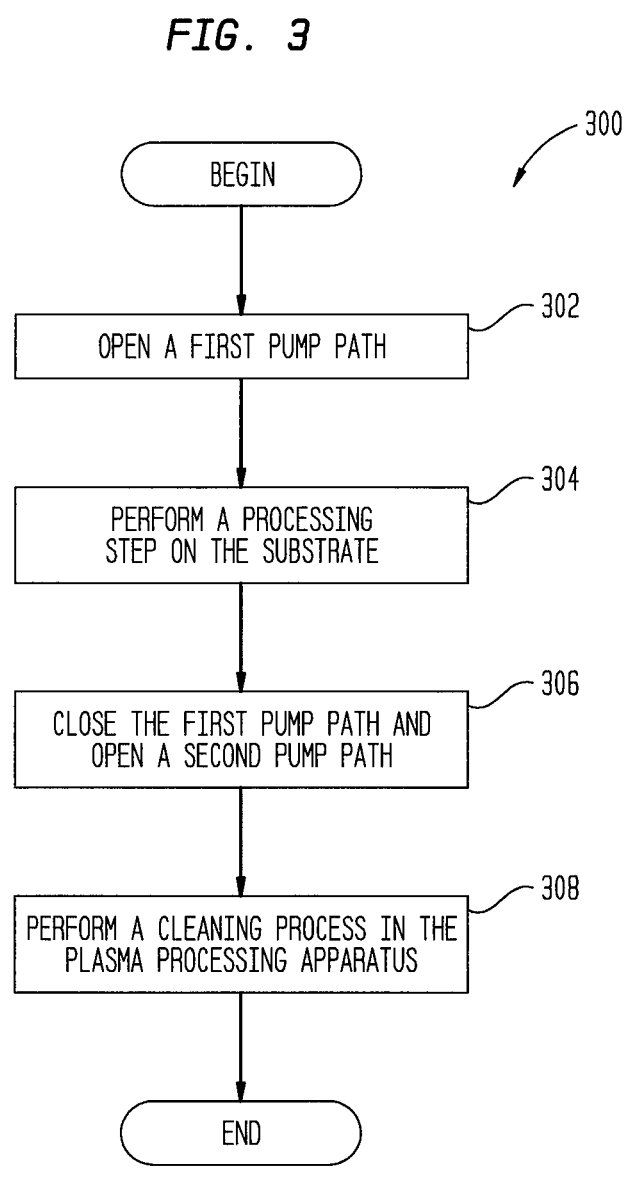

BEGIN

— 300

OPEN A FIRST PUMP PATH                    — 302

PERFORM A PROCESSING
STEP ON THE SUBSTRATE                     — 304

CLOSE THE FIRST PUMP PATH AND
OPEN A SECOND PUMP PATH                   — 306

PERFORM A CLEANING PROCESS IN THE
PLASMA PROCESSING APPARATUS              — 308

END

LOW PRESSURE LIFT PIN CAVITY HARDWARE

CROSS-REFERENCE TO RELATED APPLICATIONS

This application claims priority from U.S. Patent Application Ser. No. 62/380,084, filed Aug. 26, 2016, which is hereby incorporated by reference in its entirety.

BACKGROUND

Field

Embodiments described herein generally relate to a plasma processing apparatus, and more specifically, to a pumping system for a plasma processing apparatus.

Description of the Related Art

Electronic devices, such as flat panel displays and integrated circuits, commonly are fabricated by a series of process steps in which layers are deposited on a substrate and the deposited material is etched into desired patterns. The process steps commonly include physical vapor deposition (PVD), chemical vapor deposition (CVD), plasma enhanced CVD (PECVD), and other plasma processing. Specifically, a plasma process includes supplying a process gas mixture to a vacuum chamber, and applying electrical or electromagnetic power (RF power) to excite the process gas into a plasma state. The plasma decomposes the gas mixture into ion species that perform the desired deposition or etch process.

In certain etch applications, the processing apparatus is run with very high bias powers, which lead to the development of large RF voltages in a lower electrode that is configured to support the substrate. The lower electrode includes an opening formed therein, which allows for the passage of lift pins through the lower electrode. The high RF voltages, when combined with the high pressure in the opening, can lead to undesired plasma discharge (i.e., "light up) or arcing in the lower electrode, which can cause catastrophic failure. Conventional systems form a pump path between the opening and a pump to lower the pressure in the opening during processing. However, such continuous pumping, such as when the substrate is no longer present, results in the pumping of plasma byproducts, which can lead to erosion of chamber components.

Therefore, there is a need for an improved pumping system.

SUMMARY

Embodiments disclosed herein generally relate to a pumping system for a plasma processing apparatus. The pumping system includes a first pump path, a second pump path, a first valve, and a second valve. The first pump path couples an opening of a substrate support assembly of the processing chamber to an exhaust port of the processing chamber. The second pump path couples the opening of the substrate support assembly to an evacuation region of the processing chamber. The first valve is positioned in the first pump path. The first valve is configurable between a first state and a second state. The second valve is positioned in the second pump path. The second valve is configurable between the first state and the second state.

In another embodiment, a plasma processing apparatus is disclosed herein. The plasma processing apparatus includes a lid assembly, a chamber body, a substrate support assembly, an exhaust assembly, an exhaust port, and a pumping system. The lid assembly and a chamber body enclose a processing region. The substrate support assembly is disposed in the chamber body. The substrate support assembly has an opening formed therein. The exhaust assembly defines an evacuation region within the chamber body. The chamber body includes a plurality of passages symmetrically disposed about a central axis of the substrate support assembly fluidly connecting the processing region with the evacuation region. The exhaust port is formed through the chamber body. The pumping system includes a first pump path, a second pump path, a first valve, and a second valve. The first pump path couples the opening of the substrate support assembly to the exhaust port of the processing chamber. The second pump path coupling the opening of the substrate support assembly to the evacuation region of the processing chamber. The first valve is positioned in the first pump path. The first valve is configurable between a first state and a second state. The second valve is positioned in the second pump path. The second valve is configurable between the first state and the second state.

In another embodiment, a method of processing a substrate is disclosed herein. A first pump path defined between an opening of a substrate support assembly of a plasma processing apparatus and an exhaust port of the plasma processing apparatus is opened. A processing step is performed on the substrate. The first pump path is closed and a second pump path defined between the opening of the substrate support assembly to an evacuation region of the plasma processing apparatus is opened. A cleaning process is performed in the plasma processing apparatus.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a flow diagram of a method of processing a substrate, according to one embodiment.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
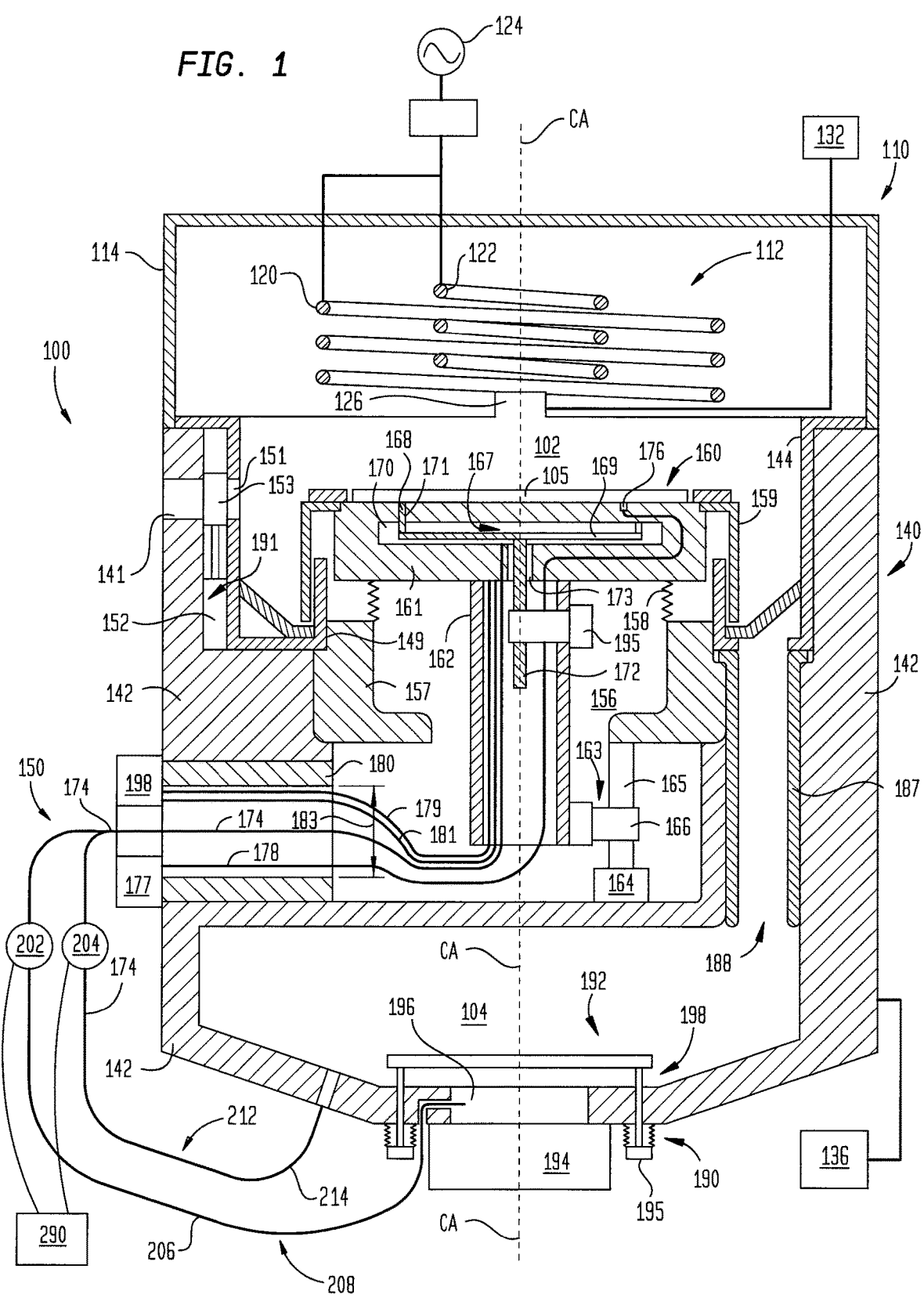
FIG. 1 illustrates a cross-sectional view of a processing chamber having an improved pumping system, according to one embodiment.

FIG. 1 is a schematic, cross-sectional view of a plasma processing apparatus 100 having a pumping system 150 coupled to a lift pin volume, according to one embodiment. The plasma processing apparatus 100 may be plasma etch chamber, a plasma enhanced chemical vapor deposition chamber, a physical vapor deposition chamber, a plasma treatment chamber, an ion implantation chamber or other suitable vacuum processing chamber, such as the Sym3 processing chamber, commercially available from Applied Materials, Inc. in Santa Clara, California.

The plasma processing apparatus 100 generally includes a source module 110, a chamber body assembly 140, and an exhaust assembly 190, which collectively enclose a processing region 102 and an evacuation region 104. In practice, processing gases are introduced into the processing region 102 and ignited into a plasma using RF power. A substrate 105 is positioned on a substrate support assembly 160 and exposed to the plasma generated in the processing region 102 to perform a plasma process on the substrate 105, such as etching, chemical vapor deposition, physical vapor deposition, implantation, plasma annealing, plasma treating, abatement, or other plasma processes. Vacuum is maintained in the processing region 102 by exhaust assembly 190, which removes spent processing gases and byproducts from the plasma process through the evacuation region 104.

In one embodiment, the source module 110 may be an inductively coupled plasma source. The source module 110 generally includes an upper electrode 112 (or anode) isolated from and supported by the chamber body assembly 140 and a chamber lid 114, enclosing the upper electrode 112. The upper electrode 112 may include an outer coil assembly 120 and an inner coil assembly 122. The outer coil assembly 120 and the inner coil assembly 122 may be connected to a radio frequency (RF) power source 124. A gas inlet tube 126 may be disposed along a central axis (CA) of the chamber body assembly 140. The gas inlet tube may be coupled with a gas source 132 to supply one or more processing gases to the processing region 102.

The chamber body assembly 140 includes a chamber body 142 fabricated from a conductive material resistant to processing environments. The substrate support assembly 160 is centrally disposed within the chamber body 142. The substrate support assembly is positioned to support the substrate 105 in the processing region 102 symmetrically about the central axis.

The processing region 102 is accessed through a slit valve tunnel 141 disposed in the chamber body 142 that allows entry and removal of the substrate 105. The upper liner assembly 144 has a slot 151 disposed therethrough that matches the slit valve tunnel 141 to allow passage of the substrate 105 therethrough. The chamber body assembly 140 includes a slit valve door assembly 191 that includes an actuator 152 positioned and configured to vertically extend a slit valve door 153 to seal the slit valve tunnel 141 and slot 151 and to vertically retract the slit valve door 153 to allow access through the slit valve tunnel 141 and slot 151. Backing liners may be provided, attached to and covering, the slots of the upper liner assembly 144. The backing liners are also in conductive contact with the upper liner assembly 144 to maintain electrical and thermal contact with the upper liner assembly 144.

The substrate support assembly 160 generally includes lower electrode 161 (or cathode) and a hollow pedestal 162. The substrate support assembly 160 is supported by a central support member 157 disposed in the central region 156 and supported by the chamber body 142. The lower electrode 161 is coupled to the RF power source 124 through a matching network (not shown) and a cable (not shown) routed through the pedestal 162. When RF power is supplied to the upper electrode 112 and the lower electrode 161, an electrical field formed therebetween ignites the processing gases present in the processing region 102 into a plasma.

The central support member 157 is sealed to the chamber body 142, such as by fasteners and o-rings (not shown). The lower electrode 161 is sealed to the central support member 157, such as by a bellows. Thus the central region 156 is sealed from the processing region 102 and may be maintained at atmospheric pressure, while the processing region 102 is maintained at vacuum conditions.

An actuation assembly 163 is positioned within the central region 156 and attached to the chamber body 142 and/or the central support member 157. The actuation assembly 163 includes an actuator 164 (e.g., motor), a lead screw 165, and a nut 166 attached to the pedestal 162. In practice, the actuator 164 rotates the lead screw 165, which, in turn raises or lowers the nut 166, and thus the pedestal 162. Since the lower electrode 161 is supported by the pedestal 162, the actuation assembly 163 provides vertical movement of the lower electrode 161 relative to the chamber body 142, the central support member 157, and the upper electrode 112. Such vertical movement of the lower electrode 161 within the processing region 102 provides a variable gap between the lower electrode 161 and the upper electrode 112, which allows increased control of the electric field formed therebetween, in turn, providing greater control of the density in the plasma formed in the processing region 102. In addition, since the substrate 105 is supported by the lower electrode 161, the gap between the substrate 105 and the showerhead plate 116 may also be varied, resulting in greater control of the process gas distribution across the substrate 105.

A plasma screen 159 is also provided, supported by the lower electrode 161 and overlapping the inner wall 149 of the upper liner assembly 144, to protect the substrate support assembly 160 and the bellows 158 from the plasma in the processing region 102. Since the plasma screen 159 is coupled to and moves vertically with the pedestal 162, the overlap between plasma screen 159 the inner wall 149 of the upper liner assembly 144 is sufficient to allow the pedestal 162 to enjoy a full range of motion without the plasma screen 159 and the upper liner assembly 144 becoming disengaged and allowing exposure of the region below the pedestal 162 to become exposed to process gases.

The substrate support assembly 160 further includes a lift pin assembly 167 to facilitate loading and unloading of the substrate 105. The lift pin assembly 167 includes lift pins 168 attached to a lift pin plate 169. The lift pin plate 169 is disposed within an opening 170 within the lower electrode 161, and the lift pins 168 extend through lift pin holes 171 disposed between the opening 170 and the processing region 102. The lift pin plate 169 is coupled to a lead screw 172 extending through an aperture 173 in the lower electrode 161 and into the hollow pedestal 162. An actuator 195 (e.g., motor) may be positioned on the pedestal 162. The actuator 195 rotates a nut, which advances or retracts the lead screw 172. The lead screw 172 is coupled to the lift pin plate 169. Thus, as the actuator 195 causes the lead screw 172 to raise or lower the lift pin plate 169, the lift pins 168 to extend or retract. Therefore, the actuator 195 allows the lift pins 168 to be extended or retracted regardless of the vertical positioning of the lower electrode 161. By providing such separate actuation of the lift pins 168, the vertical positioning of the substrate 105 can be altered separately from the vertical positioning of the lower electrode 161 allowing greater control of positioning during both loading and unloading of the substrate 105 as well as during processing of the substrate 105, for example, by lifting the substrate during processing to allow backside gas to escape from under the substrate.

The substrate support assembly 160 further includes the pumping system 150. The pumping system 150 is configured to pump any processing gases that may leak into the opening 170 via the lift pin holes 171. In certain etch applications, the processing apparatus is run with very high bias powers, which lead to the development of large RF voltages in the lower electrode 161. The high RF voltages, when combined with the high pressure in the opening 170, can lead to undesired plasma discharge (i.e., "light up) or arcing in the lower electrode 161, which can cause catastrophic failure. Conventional pumping systems provide a single pump path from either the opening 170 to the evacuation region 104, or from the opening 170 to the exhaust port 196. Because of the high bias powers needed in etch applications, the pressure in the opening 170 may be modulated to minimize the formation of parasitic plasma therein.

In a first conventional pumping system, a pump line was positioned between the opening 170 and the exhaust port 196 to create a low pressure pumping path from the high pressure in the opening 170 to the low pressure of the exhaust port 196. Although this adequately ensured a low-pressure opening 170, the continued pumping from the opening 170 to the exhaust port 196 resulted in plasma byproducts being pumped through the lower electrode 161 when the substrate was no longer present on the lower electrode (e.g., during clean processes). The pumping of plasma byproducts through the lower electrode 161 led to erosion of chamber components, such as seals, the lower electrode itself, and sealing surface along the pump path.

In a second conventional pumping system, a vent line was positioned between the opening 170 and the evacuation region 104. Although this created a simplified pumping path, this pump line did not solve the problem of lowering the pressure in the opening 170 during substrate processing. For example, coupling the pump line between the opening 170 and the evacuation region 104 was only beneficial during processes in which the substrate was not present. Such configuration resulted in plasma arcing and "light-ups" when the pressure in the plasma processing apparatus 100 was no longer equalized.

Figure 2:
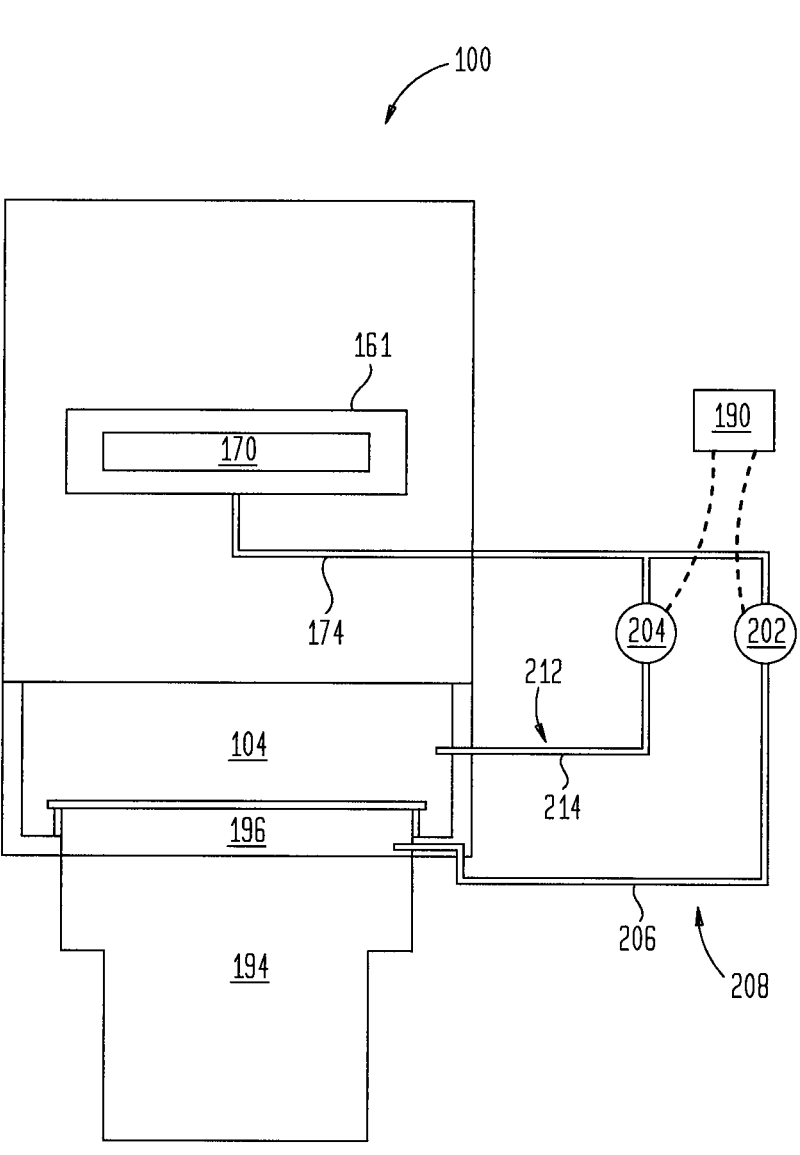
FIG. 2 illustrates a simplified view of the processing chamber of FIG. 1, according to one embodiment.

The improved pumping system 150 achieves the positives of the first and second conventional pumping systems, without the side effects of both the first and second conventional pumping systems. FIG. 2 illustrates a schematic view of the improved pumping system 150 coupled to a simplified version of the plasma processing apparatus 100. The improved pumping system 150 includes a pump line 174, a first valve 202, and a second valve 204. The pump line 174 creates a pump path between the opening 170 and the first valve 202 and the second valve 204. A second pump line 206 extends between the first valve 202 and the exhaust port 196, forming a first parallel pump path 208. The first valve 202 is configurable between an open and closed state. A third pump line 214 extends between the second valve 204 and the evacuation region 104, forming a second parallel pump path 212. The second valve 204 is configurable between an open and closed state. The improved pumping system 150 further includes a controller 290, coupled to the first valve 202 and the second valve 204. The controller 290 is configured to control switching of the first valve 202 and the second valve 204 between an open and closed state.

In operation, while the substrate is positioned on the lower electrode 161, the first valve 202 is in an open state and the second valve 204 is in a closed state. In the open state, the first valve 202 forms a first pump path 208 from the opening 170 to the exhaust port 196. The first pump path 208 creates a low pressure path from the high pressure opening 170 to the low pressure in the exhaust port 196 such that the pressure in the opening 170 is lowered while high RF voltages are developed in the lower electrode 161. Thus, the chances of plasma arcing and light up are reduced.

When the substrate is no longer positioned on the lower electrode 161, the controller 290 switches the first valve from the open state to the closed state and the second valve 204 from the closed state to the open state. In the open state, the second valve 204 forms a second pump path 212 from the opening 170 to the evacuation region 104. Rather than pumping plasma byproducts through the lower electrode 161, which can lead to erosion of chamber components, the creation of the second pump path 212 equalizes the pressure in the opening 170 by coupling the opening 170 to the exhaust port 196.

Switching between the first pump path 208 and the second pump path 212 allows the improved pumping system 150 to have all the benefits of the first conventional pump system and the second conventional pump system without the downfalls of either system. The improved pumping system 150 both minimizes the formation of parasitic plasma in the opening 170 of the lower electrode 161 during etching processes having high RF voltages and high pressure, and prevents the erosion of chamber components when the substrate is no longer present in the chamber.

Referring back to FIG. 1, the substrate support assembly 160 may also include a gas port 176 disposed therethrough and coupled to an inert gas supply 177 via a gas supply line 178. The gas supply 177 supplies an inert gas, such as helium, through the gas supply line 178 and the gas port 176 to the backside of the substrate 105 in order to help prevent processing gases from processing the backside of the substrate 105. The gas supply line 178 is also routed through the hollow pedestal 162 and out of the chamber body 142 through one of the plurality of access tubes 180.

The substrate support assembly 160 may further include one or more fluid inlet lines 179 and fluid outlet lines 181 routed from a heat exchange fluid source 198 to through one or more heat exchange channels (not shown) in the lower electrode 161 in order to provide temperature control to the lower electrode 161 during processing. The fluid inlet lines 179 and fluid outlet lines 181 are routed from the lower electrode 161 through the hollow pedestal 162 and out of the chamber body 142 through one of the plurality of access tubes 180.

One or more access tubes 180 within spokes (not shown) of the chamber body assembly 140. The spokes and access tubes 180 are symmetrically arranged about the central axis (CA) of the plasma processing apparatus 100 in a spoke pattern as shown. In the embodiment shown, three identical access tubes 180 are disposed through the chamber body 142 into the central region 156 to facilitate supply of a plurality of tubing and cabling from outside of the chamber body 142 to the lower electrode 161. In order to facilitate vertical movement of the lower electrode 161, the opening 183 through each of the access tubes 180 is approximately equal to the vertical travel of the lower electrode 161.

In order to further facilitate cable routing to the lower electrode 161, the cable routing is divided between the plurality of access tubes 180. Thus, number and volume of cabling from outside of the chamber body 142 to the lower electrode 161 are divided between the access tubes 180 in order to minimize the size of the access tubes 180 while providing adequate clearance to facilitate the movement of the lower electrode 161.

The evacuation passages are positioned in the upper liner assembly 144 symmetrically about the central axis (CA). The evacuation passages 188 allow evacuation of gases from the processing region 102 through the evacuation region 104 and out of the chamber body 142 through an exhaust port 196. The exhaust port 196 is centered about the central axis (CA) of the chamber body assembly 140 such that the gases are evenly drawn through the evacuation passages 188. Evacuation liners 187 may be respectively positioned below each of the evacuation passages 188 in evacuation channels 188 provided in the chamber body 142 in order to protect the chamber body 142 from processing gases during evacuation. The evacuation liners 187 may be constructed of materials similar to that of the upper liner assembly 144 as described above.

The exhaust assembly 190 is positioned adjacent the evacuation region 104 at the bottom of the chamber body 142. The exhaust assembly may include a throttle valve 192 coupled to a vacuum pump 194. The throttle valve 192 may be a poppet style valve used in conjunction with the vacuum pump 194 to control the vacuum conditions within the processing region 102 by symmetrically drawing exhaust gases from the processing region 102 through the evacuation passages 188 and out of the chamber through the centrally located exhaust port 196, further providing greater control of the plasma conditions in the processing region 102. A poppet style valve, as shown in FIG. 1, provides a uniform, 360 degree gap through which evacuation gases are drawn through the exhaust port 196. In contrast, conventional damper-style throttle valves provide a non-uniform gap for flow of evacuation gases. For example, when the damper-style valve opens, one side of the valve draws more gas than the other side of the valve. Thus, the poppet style throttle valve has less effect on skewing gas conductance than the traditional damper-style throttle valve conventionally used in plasma processing chambers.

The plasma processing apparatus 100 further includes a controller 136. The controller 136 is configured to aid in controlling the process parameters of the plasma processing apparatus 100. For example, the controller 136 may be configured to carry out the process recipe uploaded by an end user for the substrate to be processed. Controller 136 may be in communication with controller 290, such that efficient control of the process parameters, as well as the pumping system 150 may be achieved. In some embodiments, controller 136 and controller 290 may be combined into a single controller configured to manage both the process parameters and the pumping system 150.

FIG. 3 is a flow diagram illustrating a method 300 of processing a substrate in a plasma processing apparatus (e.g., plasma processing apparatus 100), according to one embodiment. The method 300 begins at block 302, in which a substrate has already been positioned in the plasma processing apparatus 100. Prior to beginning a process step, the controller 290 configures the first valve 202 into an open position and configures the second valve 204 into a closed position. Accordingly, controller 290 opens a first pump path 208 from the high pressure opening 170 to the low pressure exhaust port 196, while closing the second pump path 212 from the opening 170 to the evacuation region 104. Such configuration aids in reducing the pressure in opening 170 while high RF voltages are developed in the lower electrode 161 during the process step.

At block 304, the substrate that is positioned in the plasma processing apparatus 100 undergoes the process step. For example, the substrate may undergo one of a plasma etching process, a plasma enhanced chemical vapor deposition process, a physical vapor deposition process, a plasma treatment process, an ion implantation process, or any other suitable semiconductor manufacturing process.

At block 306, after the process step is complete, the substrate undergoes a de-chuck process, which involves mechanically removing the substrate from the lower electrode 161. During the de-chuck process, controller 290 switches between the first pump path 208 and the second pump path 212. Accordingly, controller 290 configures the first valve 202 from the open position to the closed position, and configures the second valve 204 from the closed position to the open position. As such, the pressure in the opening 170 is equalized.

At block 308, after the substrate is removed from the plasma processing apparatus 100, the apparatus undergoes a cleaning process. The controller 290 maintains the first valve 202 in the closed positioned and the second valve 204 in the open position. As such, the pumping system 150 does not pump the plasma byproducts through the lower electrode 161. This aids in the prevention of erosion to chamber component in the flow path.

Switching between the first pump path 208 and the second pump path 212 allows the improved pumping system 150 to have all the benefits of the first conventional pump system and the second conventional pump system without the downfalls of either system. The improved pumping system 150 both minimizes the formation of parasitic plasma in the opening 170 of the lower electrode 161 during etching processes having high RF voltages and high pressure, and prevents the erosion of chamber components when the substrate is no longer present in the chamber.

Figure 4:
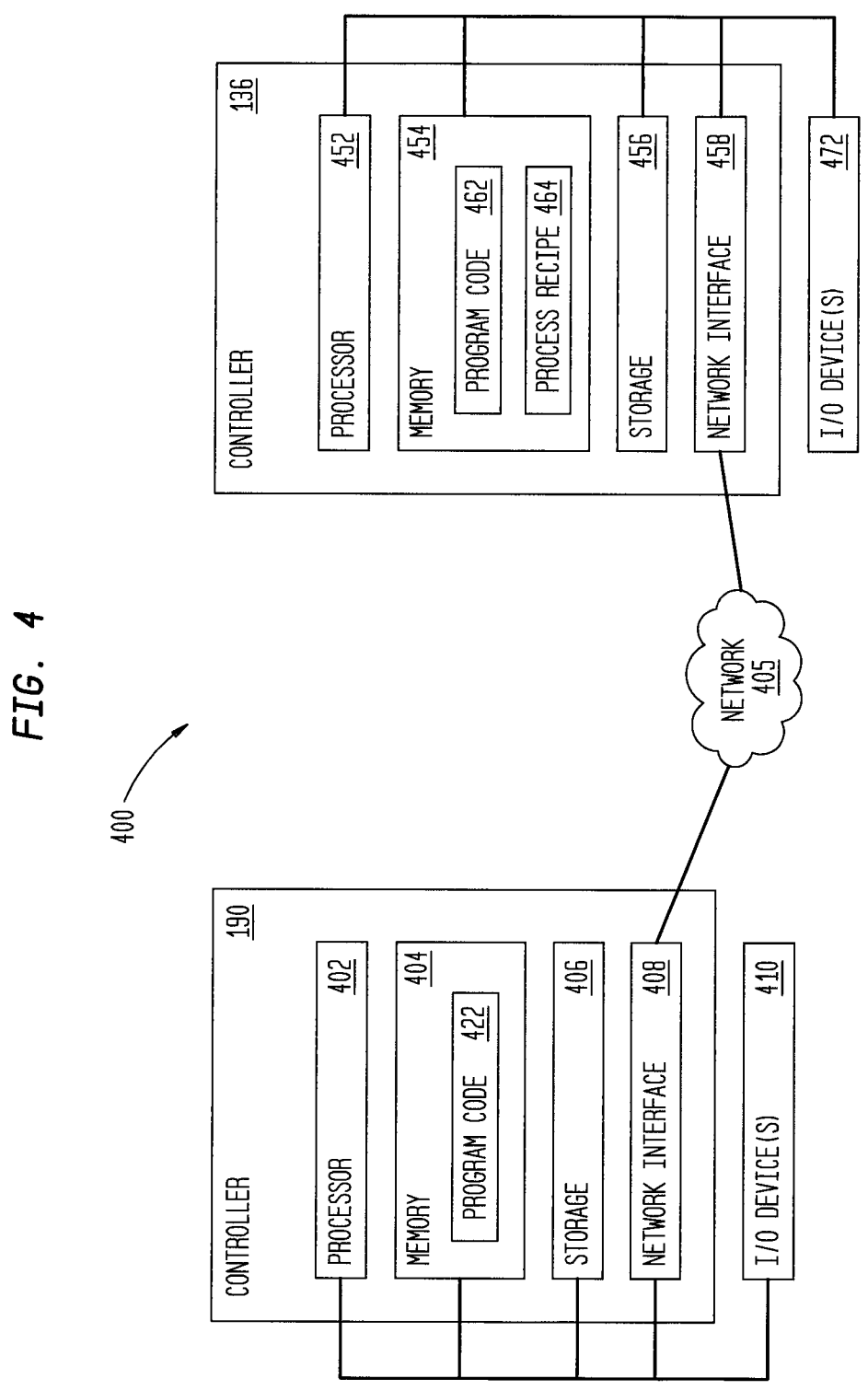
FIG. 4 illustrate a computing platform, according to one embodiment.

FIG. 4 illustrates computing platform 400, according to one embodiment. Computing platform 400 includes controller 290 and controller 136. As shown, controller 290 includes a processor 402, memory 404, storage 406, and network interface 408. In some embodiments, the controller 290 may further include one or more I/O devices 410 coupled thereto. The processor 402 is included to be representative of a single processor, multiple processors, a single processor having multiple processing cores, and the like.

The memory 404 includes program code 422. The program code 422 is configured to carry out the instructions of managing the pumping system 150. For example, the program code 422 is configured to carry out the switching between a first pump path 208 and a second pump path 212 based on the state of the plasma processing apparatus 100. For example, the controller 290 may communicate with controller 136 to determine such state.

The storage 406 may be a disk drive storage. Although shown as a single unit, the storage 406 may be a combination of fixed and/or removable storage devices, such as fixed disk drives, removable memory cards, optical storage, network attached storage (NAS), or storage-area-network (SAN). The network interface 408 may be any type of network communications allowing the controller to communicate with other computers via the network 405, such as, for example, controller 136.

Controller 136 includes a processor 452, a memory 454, storage 456, and network interface 458. The processor 452 retrieves and executes programming instructions, such as program code 462, stored in memory 454. The processor 452 is included to be representative of a single processor, multiple processors, a single processor having multiple processing cores, and the like.

The memory 454 includes program code 462 and process recipe 464. The program code 422 is configured to carry out the process recipe 464 stored in memory 454. For example, the program code 462 is configured to carry out the process recipe 464 directed to one of a plasma etching process, a plasma enhanced chemical vapor deposition process, a physical vapor deposition process, a plasma treatment process, an ion implantation process, or any other suitable semiconductor manufacturing process.

The storage 456 may be a disk drive storage. Although shown as a single unit, the storage 456 may be a combination of fixed and/or removable storage devices, such as fixed disk drives, removable memory cards, optical storage, network attached storage (NAS), or storage-area-network (SAN). The network interface 458 may be any type of network communications allowing the controller 136 to communicate with other computers via network 405, such as, for example, controller 290.

While the foregoing is directed to specific embodiments, other and further embodiments may be devised without departing from the basic scope thereof, and the scope thereof is determined by the claims that follow.

What is claimed is:

1. A pumping system for a plasma processing apparatus, comprising:
   a first pump line coupling a lift pin opening of a substrate support assembly of a processing chamber to a first valve and a second valve;
   a first pump path in a second pump line coupling the first valve to an exhaust port of the processing chamber, the first valve configurable between a first state and a second state;
   a second pump path in a third pump line coupling the second valve to an evacuation region of the processing chamber, the second valve configurable between the first state and the second state, the evacuation region of the processing chamber positioned within a chamber body of the processing chamber upstream of the exhaust port of the processing chamber.

2. The pumping system of claim 1, further comprising:
   a controller coupled to the first valve and the second valve, the controller configured to switch the first valve between the first state and the second state, and the second valve between the first state and the second state.

3. The pumping system of claim 2, wherein the controller of the pumping system is in communication with a controller of the plasma processing apparatus.

4. The pumping system of claim 1, wherein the first valve is in the first state and the second valve is in the second state.

5. The pumping system of claim 4, wherein the first state is an open state that fluidly couples the opening of the substrate support assembly to the exhaust port, and wherein the second state is a closed state that does not allow for fluid communication between the substrate support assembly and the evacuation region.

6. A plasma processing apparatus, comprising:
   a lid assembly and a chamber body enclosing a processing region;
   a substrate support assembly disposed in the chamber body, the substrate support assembly having a lift pin opening formed therein;
   an exhaust assembly defining an evacuation region within the chamber body, wherein the chamber body includes a plurality of passages symmetrically disposed about a central axis of the substrate support assembly fluidly connecting the processing region with the evacuation region;
   an exhaust port formed through the chamber body; and
   a pumping system for the plasma processing apparatus, comprising a first pump line coupling a lift pin opening of a substrate support assembly of a processing chamber to a first valve and a second valve;
   a first pump path in a second pump line coupling the first valve to an exhaust port of the processing chamber, the first valve configurable between a first state and a second state;
   a second pump path in a third pump line coupling the second valve to an evacuation region of the processing chamber, the second valve configurable between the first state and the second state, the evacuation region of the processing chamber positioned within a chamber body of the processing chamber upstream of the exhaust port of the processing chamber.

7. The plasma processing apparatus of claim 6, wherein the substrate support assembly comprises:
   a support pedestal; and
   a lower electrode, wherein the lift pin opening is formed in the lower electrode.

8. The plasma processing apparatus of claim 6, further comprising:
   a controller coupled to the first valve and the second valve, the controller configured to switch the first valve between the first state and the second state, and the second valve between the first state and the second state.

9. The plasma processing apparatus of claim 8, wherein the controller of the pumping system is in communication with a controller of the plasma processing apparatus.

10. The plasma processing apparatus of claim 6, wherein the first valve is in the first state and the second valve is in the second state.

11. The plasma processing apparatus of claim 10, wherein the first state is an open state that fluidly couples the lift pin opening of the substrate support assembly to the exhaust port, and wherein the second state is a closed state that does not allow for fluid communication between the substrate support assembly and the evacuation region.

* * * * *